(12) United States Patent
Kamiya

(10) Patent No.: US 9,947,897 B2
(45) Date of Patent: Apr. 17, 2018

(54) METHOD OF MANUFACTURING DISPLAY DEVICE

(71) Applicant: Japan Display Inc., Minato-ku (JP)

(72) Inventor: Akinori Kamiya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/416,085

(22) Filed: Jan. 26, 2017

(65) Prior Publication Data

US 2017/0271618 A1 Sep. 21, 2017

(30) Foreign Application Priority Data

Mar. 18, 2016 (JP) .................................. 2016-055411

(51) Int. Cl.
*H01L 51/52* (2006.01)
*H01L 51/56* (2006.01)
*H01L 27/32* (2006.01)
*G02F 1/1345* (2006.01)

(52) U.S. Cl.
CPC ...... *H01L 51/5253* (2013.01); *H01L 27/3276* (2013.01); *H01L 51/524* (2013.01); *H01L 51/5246* (2013.01); *H01L 51/56* (2013.01); *G02F 1/13452* (2013.01); *H01L 27/3244* (2013.01); *H01L 2227/323* (2013.01)

(58) Field of Classification Search
CPC ................. H01L 51/56; H01L 51/0011; H01L 51/0014–51/0019; H01L 51/5246; H01L 51/5253; H01L 51/524; H01L 27/3244; H01L 27/3276; H01L 2227/323; G02F 1/13452
See application file for complete search history.

(56) References Cited

U.S. PATENT DOCUMENTS

| 5,851,862 A | * | 12/1998 | Ohtani | ................. H01L 21/2026 117/8 |
| 2004/0061434 A1 | * | 4/2004 | Mori | ....................... H01L 51/56 313/500 |
| 2007/0013070 A1 | * | 1/2007 | Liang | .................. H01L 21/3185 257/758 |
| 2007/0054430 A1 | * | 3/2007 | Nishigaki | ........... H01L 51/5253 438/29 |

(Continued)

FOREIGN PATENT DOCUMENTS

| JP | 2004-14236 | 1/2004 |
| JP | 2007-73353 | 3/2007 |

*Primary Examiner* — Marvin Payen
*Assistant Examiner* — Jeremy Joy
(74) *Attorney, Agent, or Firm* — Oblon, McClelland, Maier & Neustadt, L.L.P.

(57) ABSTRACT

A substrate including a light-emitting element and a terminal for connection to the outside is prepared. The light-emitting element includes a light-emitting layer, an anode, and a cathode. The anode and the cathode interpose the light-emitting layer therebetween. A sealing layer is formed on the substrate so as to cover the light-emitting element and the terminal. An amorphous carbon film is formed on the sealing layer so as to cover a region above the light-emitting element and avoid a region above the terminal. The sealing layer is dry-etched so as to expose the terminal from the sealing layer using the amorphous carbon film as a mask. The amorphous carbon film is removed.

5 Claims, 7 Drawing Sheets

(56) References Cited

U.S. PATENT DOCUMENTS

| | | | |
|---|---|---|---|
| 2008/0182350 A1* | 7/2008 | Lin | H01L 27/1248 438/30 |
| 2009/0011602 A1* | 1/2009 | Nozawa | C23C 16/26 438/694 |
| 2009/0288680 A1* | 11/2009 | Kaneko | H01L 27/3276 134/4 |
| 2014/0216498 A1* | 8/2014 | Lee | G03F 7/427 134/1.1 |
| 2015/0287959 A1* | 10/2015 | Hanamura | H01L 51/5246 257/40 |
| 2016/0072099 A1* | 3/2016 | Okamoto | H01L 51/5253 257/40 |
| 2016/0154268 A1* | 6/2016 | Yamazaki | H01L 51/5246 349/138 |
| 2016/0320643 A1* | 11/2016 | Lee | H01L 51/56 |
| 2016/0351652 A1* | 12/2016 | Kim | H01L 51/0018 |

* cited by examiner

METHOD OF MANUFACTURING DISPLAY DEVICE

CROSS-REFERENCE TO RELATED APPLICATION

The present application claims priority from Japanese application JP2016-055411 filed on Mar. 18, 2016, the content of which is hereby incorporated by reference into this application.

BACKGROUND OF THE INVENTION

1. Field of the Invention

The present invention relates to a method of manufacturing a display device.

2. Description of the Related Art

A light-emitting element such as an organic electroluminescent element deteriorates due to moisture absorption, and therefore needs to be covered by a sealing film for shielding from the atmosphere. The sealing film is formed to avoid terminals for electrical connection to the outside. Since the light-emitting element is moisture sensitive, it is desirable to avoid patterning the film by applying photolithography, which is a wet process.

When the sealing film is deposited by masking the region where the terminals are formed, a film material stacked on the mask is detached and serves as a foreign substance, thereby causing a problem of reduced yield. JP 2007-073353 A discloses to pattern a sealing film by dry etching using a metal mask. JP 2004-014236 A discloses to carry out dry etching using a passivation film as a mask for patterning an upper electrode, but does not describe the patterning of a sealing film.

SUMMARY OF THE INVENTION

It is an object of the invention to expose a terminal from a sealing film by a simple method.

A method of manufacturing a display device according to an aspect of the invention includes the steps of: preparing a substrate including a light-emitting element and a terminal for connection to the outside, the light-emitting element including a light-emitting layer, an anode, and a cathode, the anode and the cathode interposing the light-emitting layer therebetween; forming a sealing layer on the substrate so as to cover the light-emitting element and the terminal; forming an amorphous carbon film on the sealing layer so as to cover a region above the light-emitting element and avoid a region above the terminal; dry-etching the sealing layer so as to expose the terminal from the sealing layer using the amorphous carbon film as a mask; and removing the amorphous carbon film. According to the aspect of the invention, the terminal can be exposed from the sealing film by a simple method using dry etching with the amorphous carbon film used as a mask.

DETAILED DESCRIPTION OF THE INVENTION

Figure 1:
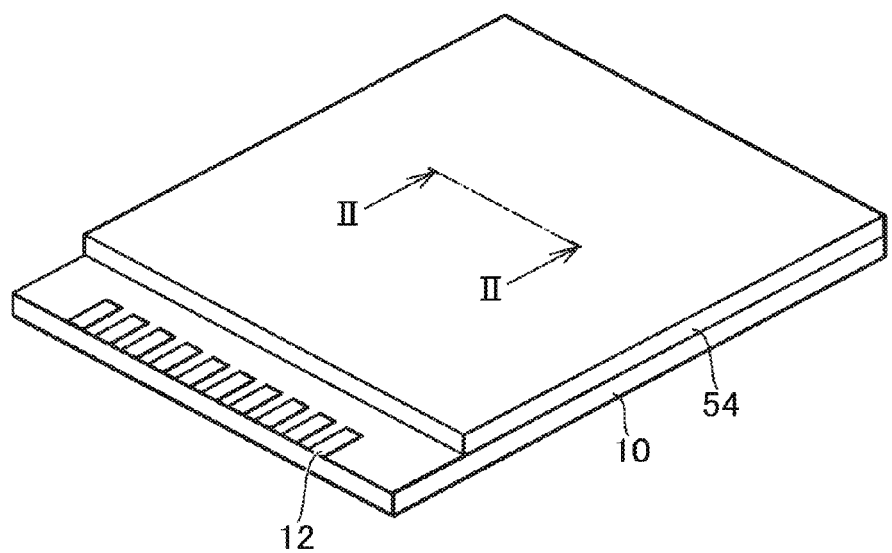
FIG. 1 is a perspective view of a display device according to an embodiment of the invention.

Hereinafter, embodiments of the invention will be described with reference to the drawings. However, the invention can be implemented in various aspects within the scope not departing from the gist of the invention, and should not be interpreted as being limited to the description of the embodiments illustrated below.

For more clarity of description, the width, thickness, shape, and the like of each part may be schematically represented in the drawings, as compared with those in practicing aspects of the invention. However, they are illustrative only and do not limit the interpretation of the invention. In the specification and the drawings, elements having functions similar to those described in relation to a previous drawing are denoted by the same reference numerals and signs, and a repetitive description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

FIG. 1 is a perspective view of a display device according to an embodiment of the invention. As the display device, an organic electroluminescent display device is exemplified. The display device is configured such that, for example, unit pixels (sub-pixels) of multiple colors of red, green, and blue are combined to form a full-color pixel (pixel), thereby displaying a full-color image. The display device includes a first substrate 10 made of a material having flexibility, such as resin. Terminals 12 for electrical connection to the outside are provided on the first substrate 10.

Figure 2:
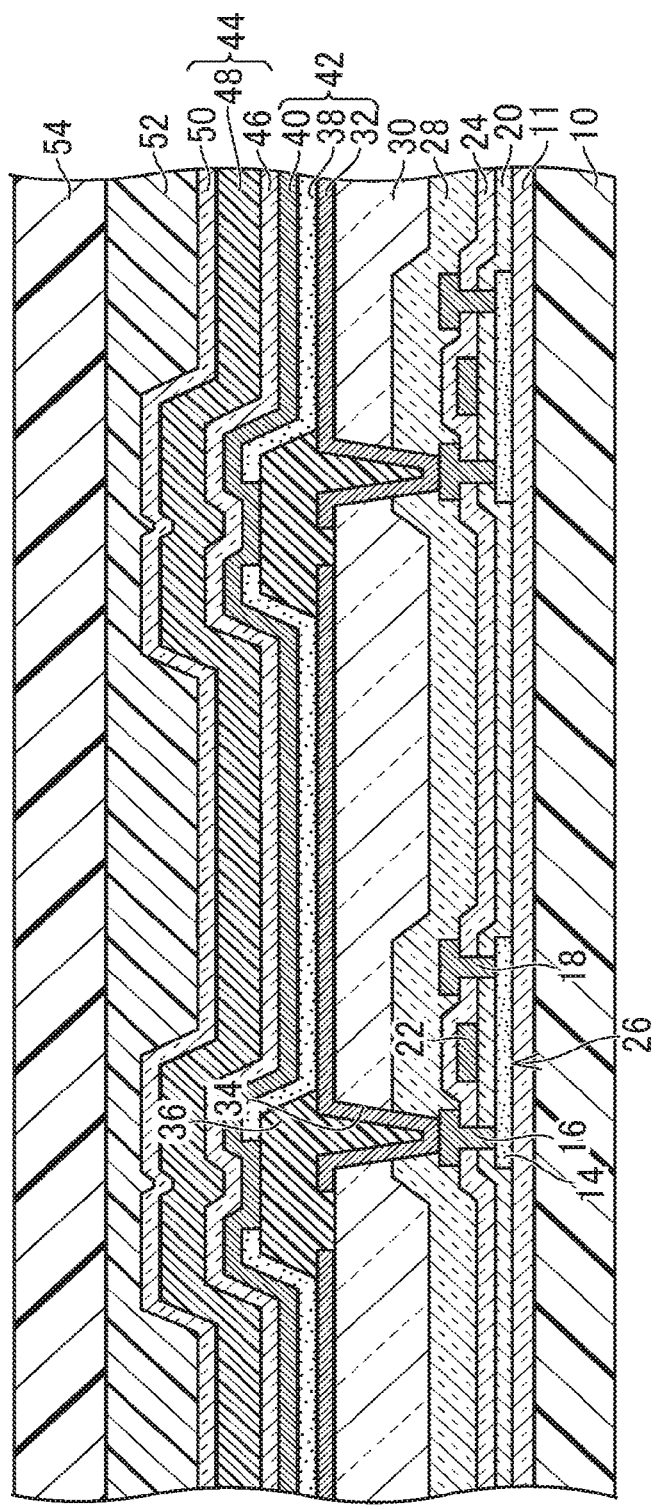
FIG. 2 is an enlarged view of a cross-section of the display device shown in FIG. 1, taken along line II-II.

FIG. 2 is an enlarged view of a cross-section of the display device shown in FIG. 1, taken along line II-II. An undercoat 11 serving as a barrier to an impurity contained in the first substrate 10 itself is formed on the first substrate 10, and a semiconductor layer 14 is formed on the undercoat 11. A source electrode 16 and a drain electrode 18 are electrically connected to the semiconductor layer 14, and a gate insulating film 20 is formed to cover the semiconductor layer 14. A gate electrode 22 is formed on the gate insulating film 20, and an inter-layer insulating film 24 is formed to cover the gate electrode 22. The source electrode 16 and the drain electrode 18 penetrate the gate insulating film 20 and the inter-layer insulating film 24. The semiconductor layer 14, the source electrode 16, the drain electrode 18, and the gate electrode 22 constitute a thin film transistor 26. A passivation film 28 is provided so as to cover the thin film transistor 26.

A planarization layer 30 is provided on the passivation film 28. A plurality of pixel electrodes 32 (e.g., anodes)

configured so as to correspond to a plurality of unit pixels are provided on the planarization layer 30. The planarization layer 30 is formed such that at least the surface on which the pixel electrode 32 is provided is flat. The pixel electrode 32 is electrically connected to one of the source electrode 16 and the drain electrode 18 on the semiconductor layer 14 through a contact hole 34 penetrating the planarization layer 30 and the passivation film 28.

An insulating layer 36 is formed on the planarization layer 30 and the pixel electrode 32. The insulating layer 36 is formed so as to lie on the peripheral edge of the pixel electrode 32 and open a portion (e.g., a central portion) of the pixel electrode 32. The insulating layer 36 forms a bank surrounding a portion of the pixel electrode 32.

A light-emitting layer 38 is provided on the pixel electrode 32. The light-emitting layer 38 is provided individually (separately) for each of the pixel electrodes 32, and also lies on the insulating layer 36. In this case, the light-emitting layers 38 emit blue, red, and green light corresponding to the respective pixels. As a modified example, the light-emitting layer 38 may be provided so as to continuously lie on the plurality of pixel electrodes to emit white light, in which case a color filter is provided.

A common electrode 40 (e.g., a cathode) is provided on the light-emitting layer 38. The common electrode 40 is formed so as to lie above the insulating layer 36 serving as a bank. The light-emitting layer 38, and the pixel electrode 32 (anode) and the common electrode 40 (cathode) interposing the light-emitting layer 38 therebetween constitute a light-emitting element 42. The light-emitting layer 38 is interposed between the pixel electrode 32 and the common electrode 40, and emits light with a luminance controlled by an electric current flowing therebetween. At least one layer of a hole transport layer and a hole injection layer (both not shown) may be provided between the light-emitting layer 38 and the pixel electrode 32 (anode). At least one layer of an electron transport layer and an electron injection layer (both not shown) may be provided between the light-emitting layer 38 and the common electrode 40 (cathode).

The light-emitting element 42 is covered and thus sealed by a sealing layer 44 stacked on the common electrode 40, so that the light-emitting element 42 is shielded from moisture. The sealing layer 44 includes a first inorganic layer 46, an organic layer 48 stacked on the first inorganic layer 46, and a second inorganic layer 50 stacked on the organic layer 48. Each of the first inorganic layer 46 and the second inorganic layer 50 is composed of a silicon nitride film. The organic layer 48 fills pinholes in the first inorganic layer 46 and covers a foreign substance, and thus serves as a flat base on which the second inorganic layer 50 lies. A second substrate 54 made of a material having flexibility, such as resin, is attached to the sealing layer 44 via an adhesive layer 52.

FIGS. 3A to 7B are diagrams showing a method of manufacturing the display device according to an embodiment of the invention. FIGS. 3A, 4A, 5A, 6A, and 7A are plan views, while FIGS. 3B, 4B, 5B, 6B, and 7B are partially enlarged cross-sectional views of the plan views shown in FIGS. 3A, 4A, 5A, 6A, and 7A.

Figure 3A:
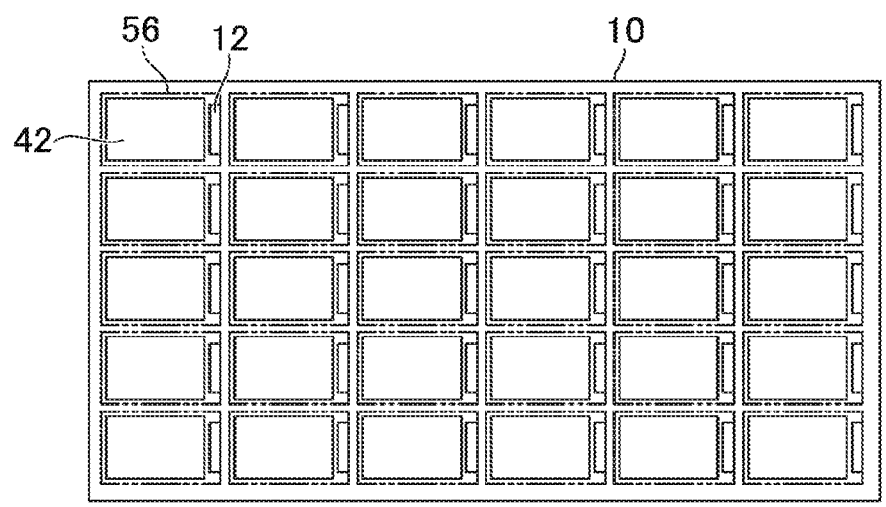
FIGS. 3A and 3B are diagrams showing a method of manufacturing the display device according to an embodiment of the invention.
Figure 3B:
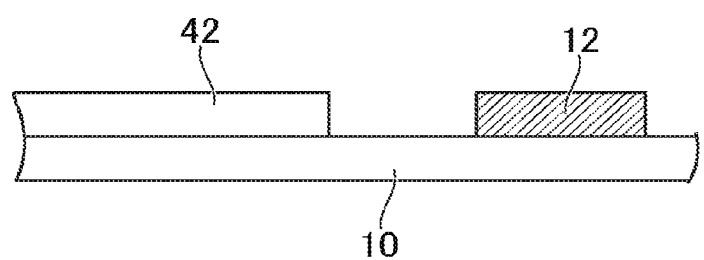

As shown in FIGS. 3A and 3B, the first substrate 10 is prepared. The first substrate 10 includes the light-emitting element 42. The light-emitting element 42 includes the light-emitting layer 38, and the pixel electrode 32 (anode) and the common electrode 40 (cathode) interposing the light-emitting layer 38 therebetween as shown in FIG. 2. The first substrate 10 includes the terminals 12 for connection to the outside. In FIG. 3A, the plurality of terminals 12 are shown in a simplified manner. As shown in FIG. 3A, the first substrate 10 is prepared so as to include the light-emitting element 42 and the terminal 12 in each of a plurality of product regions 56. The first substrate 10 is cut for each of the product regions 56 in the end.

Figure 4A:
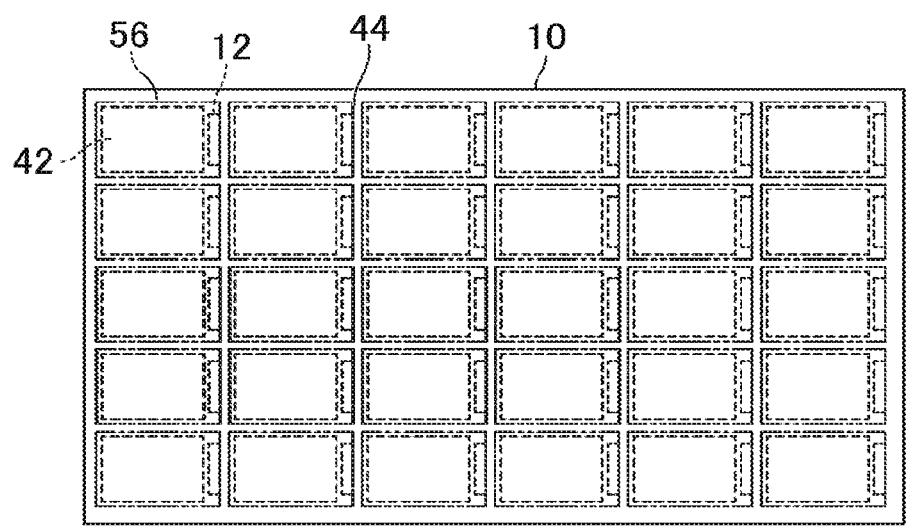
FIGS. 4A and 4B are diagrams showing the method of manufacturing the display device according to the embodiment of the invention.
Figure 4B:
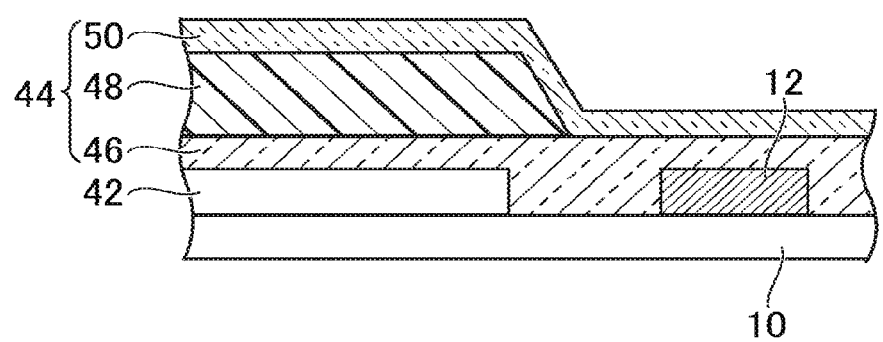

As shown in FIGS. 4A and 4B, the sealing layer 44 is formed on the first substrate 10 so as to cover the light-emitting element 42 and the terminal 12. Specifically, the first inorganic layer 46 is formed so as to cover the light-emitting element 42. Next, the organic layer 48 is formed on the first inorganic layer 46. The organic layer 48 overlaps the entire light-emitting element 42, but is formed to avoid overlapping a partial region around the light-emitting element 42. For example, the organic layer is provided to avoid a region above the terminal 12. Moreover, the organic layer 48 is formed to avoid a region (i.e., a cut region) between the product regions 56 adjacent to each other. Then, the second inorganic layer 50 is formed so as to cover the organic layer 48. The second inorganic layer 50 is formed so as to directly lie on the first inorganic layer 46 around the organic layer 48. That is, the second inorganic layer 50 is formed so as to include a portion that directly lies on the first inorganic layer 46. The second inorganic layer 50 is formed so as to directly lie on the first inorganic layer 46 above the terminal 12.

Figure 5A:
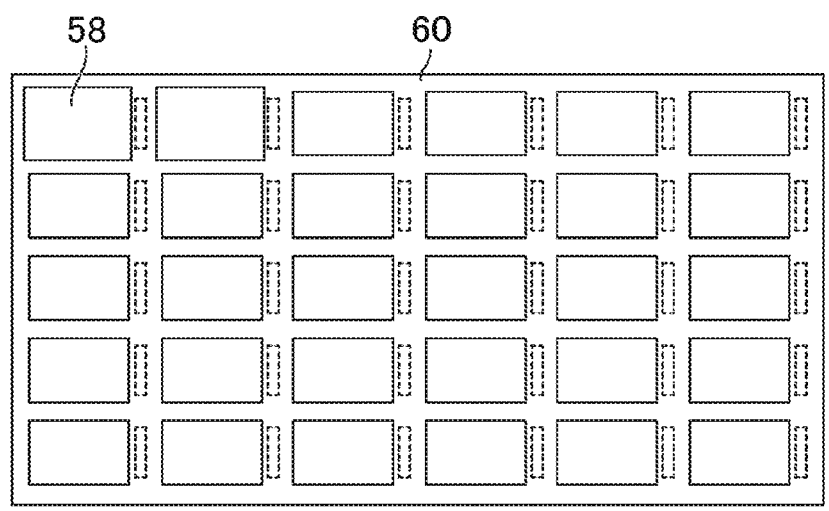
FIGS. 5A and 5B are diagrams showing the method of manufacturing the display device according to the embodiment of the invention.
Figure 5B:
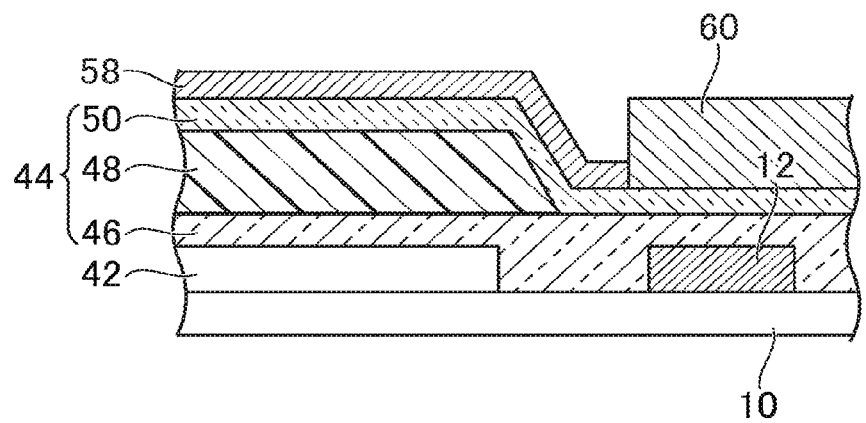

As shown in FIGS. 5A and 5B, an amorphous carbon film 58 is formed on the sealing layer 44 so as to cover a region above the light-emitting element 42 and avoid a region above the terminal 12. The amorphous carbon film 58 is formed so as to also lie on a portion of the portion of the second inorganic layer 50 directly lying on the first inorganic layer 46. Moreover, the amorphous carbon film 58 is formed to avoid the region between the product regions 56 adjacent to each other. For enabling such a formation, specifically, the amorphous carbon film 58 is formed by evaporation by masking the region above the terminal 12 with a metal mask 60.

Figure 6A:
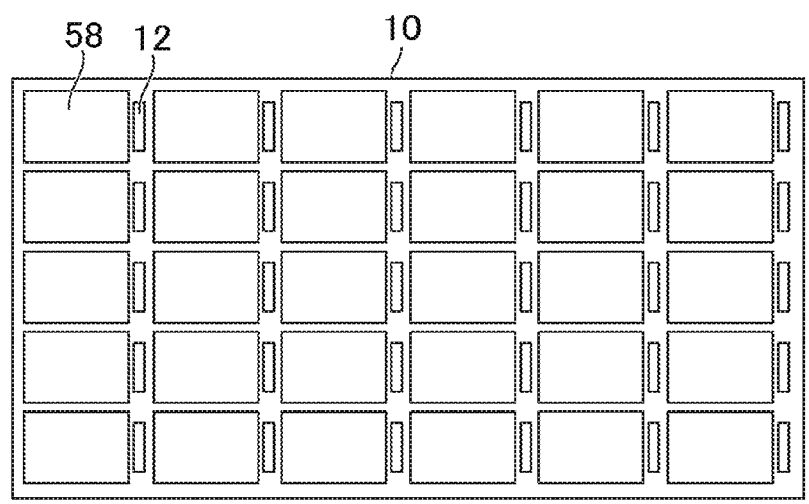
FIGS. 6A and 6B are diagrams showing the method of manufacturing the display device according to the embodiment of the invention.
Figure 6B:
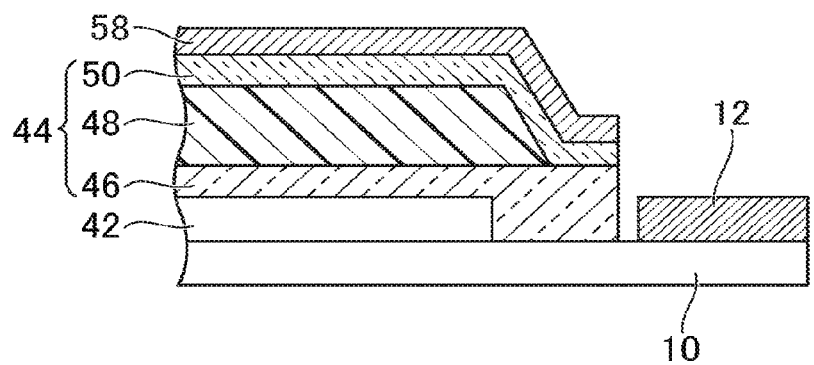

As shown in FIGS. 6A and 6B, the sealing layer 44 is dry-etched so as to expose the terminal 12 from the sealing layer 44 using the amorphous carbon film 58 as a mask. Since the amorphous carbon film 58 is used as a mask, a taper is not formed at the edge of the sealing layer 44 subjected to etching.

Figure 7A:
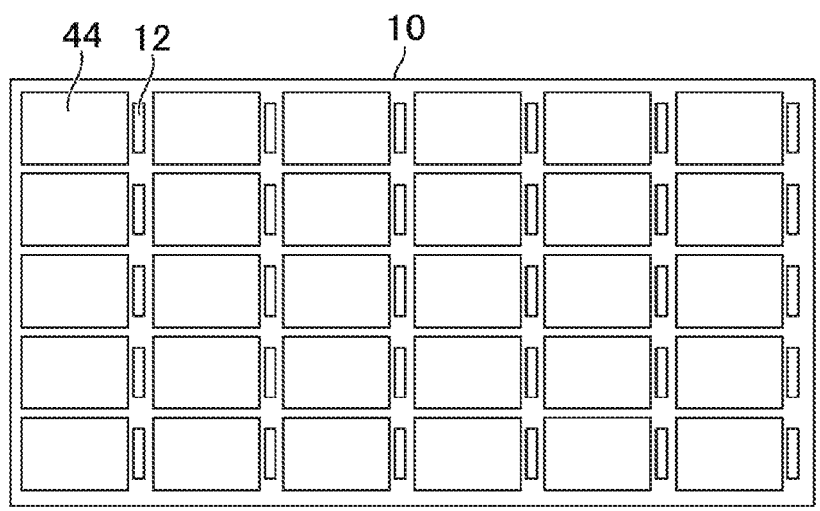
FIGS. 7A and 7B are diagrams showing the method of manufacturing the display device according to the embodiment of the invention.
Figure 7B:
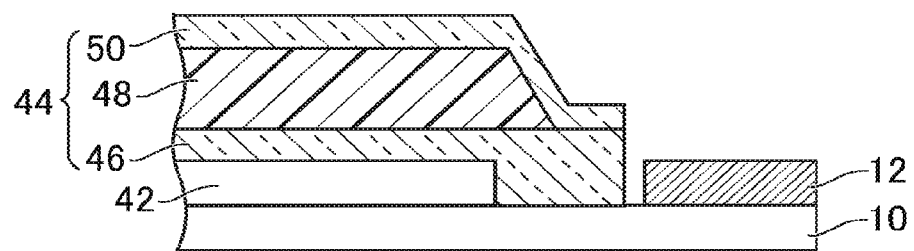

As shown in FIGS. 7A and 7B, the amorphous carbon film 58 is removed. This is performed by washing with water. Thereafter, as shown in FIG. 2, the second substrate 54 made of a material having flexibility, such as resin, is attached to the sealing layer 44 via the adhesive layer 52. Moreover, the first substrate 10, the second substrate 54, and the layers interposed between the first substrate 10 and the second substrate 54 are cut for each of the product regions 56 (see FIGS. 3A and 4A). According to the embodiment, the terminal 12 can be exposed from the sealing film by a simple method using dry etching with the amorphous carbon film 58 used as a mask.

The display device is not limited to an organic electroluminescent display device. The display device may be a display device including a light-emitting element such as a quantum-dot light-emitting element (quantum-dot light-emitting diode (QLED)) in each pixel, or a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing a display device, comprising the steps of:
   preparing a substrate including a light-emitting element and a terminal for connection to the outside, the light-emitting element including a light-emitting layer, an anode, and a cathode, the anode and the cathode interposing the light-emitting layer therebetween;
   forming a sealing layer on the substrate so as to cover the light-emitting element and the terminal;
   forming an amorphous carbon film on the sealing layer by evaporation so as to cover a region above the light-emitting element and avoid a region above the terminal, by masking the region above the terminal with a metal mask;
   dry-etching the sealing layer so as to expose the terminal from the sealing layer using the amorphous carbon film as a mask; and
   removing the amorphous carbon film.

2. The method of manufacturing a display device according to claim 1, wherein
   the step of forming the sealing layer includes the steps of forming a first inorganic layer,
   forming an organic layer on the first inorganic layer, and
   forming a second inorganic layer so as to cover the organic layer and include a portion that directly lies on the first inorganic layer.

3. The method of manufacturing a display device according to claim 2, wherein
   in the step of forming the amorphous carbon film, the amorphous carbon film, is formed so as to also lie on a portion of the portion of the second inorganic layer directly lying on the first inorganic layer.

4. The method of manufacturing a display device according to claim 1, wherein
   the step of removing the amorphous carbon film is performed by washing with water.

5. The method of manufacturing a display device according to claim 1, wherein
   in the step of preparing the substrate, the substrate is prepared so as to include the light-emitting element and the terminal in each of a plurality of product regions, and
   in the step of forming the amorphous carbon film, the amorphous carbon film is formed to avoid a region between the product regions adjacent to each other.

* * * * *